(12) United States Patent
Alexander et al.

(10) Patent No.: US 9,444,449 B2
(45) Date of Patent: Sep. 13, 2016

(54) CIRCUITS, METHODS, AND SYSTEMS WITH OPTIMIZED OPERATION OF DOUBLE-BASE BIPOLAR JUNCTION TRANSISTORS

(71) Applicant: Ideal Power Inc., Austin, TX (US)

(72) Inventors: William C. Alexander, Spicewood, TX (US); Richard A. Blanchard, Los Altos, CA (US)

(73) Assignee: Ideal Power Inc., Austin, TX (US)

(*) Notice: Subject to any disclaimer, the term of this patent is extended or adjusted under 35 U.S.C. 154(b) by 0 days.

(21) Appl. No.: 14/935,344

(22) Filed: Nov. 6, 2015

(65) Prior Publication Data

US 2016/0173083 A1    Jun. 16, 2016

Related U.S. Application Data

(60) Provisional application No. 62/076,320, filed on Nov. 6, 2014, provisional application No. 62/100,301, filed on Jan. 6, 2015, provisional application No. 62/130,470, filed on Mar. 9, 2015, provisional (Continued)

(51) Int. Cl.
*H03K 17/0412* (2006.01)
*H03K 17/60* (2006.01)

(Continued)

(52) U.S. Cl.
CPC .............. *H03K 17/60* (2013.01); *H01L 29/747* (2013.01); *H01L 29/7416* (2013.01); *H01L 29/872* (2013.01)

(58) Field of Classification Search
CPC .... H03K 17/60; H01L 29/747; H01L 29/872
See application file for complete search history.

(56) References Cited

U.S. PATENT DOCUMENTS 5,608,237 A * 3/1997 Aizawa ............... H01L 29/7395
                                                             257/119
7,728,367 B2 * 6/2010 Bui ..................... H01L 31/0236
                                                             257/292

(Continued)

FOREIGN PATENT DOCUMENTS

GB              2510716 A  * 8/2014  ....... H01L 29/66295
GB   WO 2014122472 A1 * 8/2014  ....... H01L 29/66295

OTHER PUBLICATIONS

International Search Report and Written Opinion for corresponding application PCT/US15/59623, mailed Apr. 8, 2016 by KIPO.

*Primary Examiner* — William F Kraig
*Assistant Examiner* — Pavel Ivanov
(74) *Attorney, Agent, or Firm* — Robert O. Groover, III; Gwendolyn S. S. Groover

(57) ABSTRACT

The present application teaches, inter alia, methods and circuits for operating a B-TRAN (double-base bidirectional bipolar junction transistor). Exemplary base drive circuits provide high-impedance drive to the base contact region on the side of the device instantaneously operating as the collector. (The B-TRAN is controlled by applied voltage rather than applied current.) Current signals operate preferred implementations of drive circuits to provide diode-mode turn-on and pre-turnoff operation, as well as a hard ON state with low voltage drop (the "transistor-ON" state). In some preferred embodiments, self-synchronizing rectifier circuits provide adjustable low voltage for gate drive circuits. In some preferred embodiments, the base drive voltage used to drive the c-base region (on the collector side) is varied while base current at that terminal is monitored, so no more base current than necessary is applied. This solves the difficult challenge of optimizing base drive in a B-TRAN.

9 Claims, 10 Drawing Sheets

Related U.S. Application Data application No. 62/162,907, filed on May 18, 2015, provisional application No. 62/182,878, filed on Jun. 22, 2015, provisional application No. 62/194,167, filed on Jul. 17, 2015, provisional application No. 62/185,543, filed on Feb. 26, 2015.

(51) Int. Cl.
*H01L 29/747* (2006.01)
*H01L 29/74* (2006.01)
*H01L 29/872* (2006.01)

(56) References Cited

U.S. PATENT DOCUMENTS

| | | | | |
|---|---|---|---|---|
| 8,796,750 B2* | 8/2014 | Bui | ............ | H01L 31/02327 257/292 |
| 2012/0069605 A1 | 3/2012 | Choi | | |
| 2014/0375287 A1* | 12/2014 | Blanchard | ............ | H01L 29/0817 323/271 |
| 2014/0376291 A1* | 12/2014 | Blanchard | ............ | H01L 29/0817 363/123 |
| 2015/0029769 A1* | 1/2015 | Blanchard | ............ | H01L 29/0817 363/123 |
| 2015/0054552 A1* | 2/2015 | Blanchard | ............ | H01L 29/0817 327/109 |
| 2015/0061732 A1* | 3/2015 | Blanchard | ............ | H01L 29/0817 327/109 |
| 2015/0270771 A1* | 9/2015 | Alexander | ............ | H01L 29/0817 363/123 |
| 2015/0270837 A1* | 9/2015 | Alexander | ............ | H01L 29/0817 327/478 |
| 2015/0280613 A1* | 10/2015 | Alexander | ............ | H01L 29/0817 363/123 |
| 2015/0288358 A1* | 10/2015 | Alexander | ............ | H01L 29/0817 327/478 |
| 2015/0303915 A1* | 10/2015 | Alexander | ............ | H01L 29/0817 327/478 |
| 2015/0311777 A1* | 10/2015 | Alexander | ............ | H01L 29/0817 363/123 |

* cited by examiner

CIRCUITS, METHODS, AND SYSTEMS WITH OPTIMIZED OPERATION OF DOUBLE-BASE BIPOLAR JUNCTION TRANSISTORS

CROSS-REFERENCE

Priority is claimed from U.S. Applications 62/076,320, 62/100,301, 62/130,470, 62/162,907, 62/182,878, 62/194, 167, and 62/185,543, all of which are hereby incorporated by reference.

This application is being filed simultaneously with two other related applications: Ser. No. 14/935,336 ("Variable-Voltage Self-Synchronizing Rectifier Circuits, Methods, and Systems", IPC-225), Ser. No. 14/935,344 ("Circuits, Methods, and Systems with Optimized Operation of Double-Base Bipolar Junction Transistors", IPC-234), and Ser. No. 14/935,349 ("Operating Point Optimization with Double-Base-Contact Bidirectional Bipolar Junction Transistor Circuits, Methods, and Systems", IPC-258), all of which are hereby incorporated by reference in their entirety.

BACKGROUND

The present application relates to power switching methods, and particularly to circuits and methods for operation of bipolar power switching transistors which have two distinct and independent base connections.

Note that the points discussed below may reflect the hindsight gained from the disclosed inventions, and are not necessarily admitted to be prior art.

Published U.S. application US 2014-0375287 (which is hereby incorporated by reference) disclosed a fully bidirectional bipolar transistor with two base terminals. Such transistors are referred to as "B-TRANs." The transistor preferably uses the bulk of a semiconductor die as a base region, and has two emitter/collector regions on opposite faces of the die. Two distinct base contact regions are also provided—one on each face of the die. Thus, for example, with a p-type semiconductor die, each face would include an n+ emitter/collector region and a p-type base contact region. Isolation trenches and peripheral field-limiting rings are preferably also included, but in essence this is a four-terminal three-layer device.

An example of this published structure is generally illustrated in FIG. 6. In this Figure, both faces of a semiconductor die 610 carry emitter/collector regions 622 which form a junction with the bulk substrate 610. Base contact regions 632 are also present on both faces. This example shows an npn structure, so the emitter/collector regions 622 are n-type, and the base contact regions 632 are p-type. A shallow n+ contact doping 624 provides ohmic contact from separate terminals EC1 and EC2 (on the two opposite faces of the semiconductor die, in this example) to regions 622, and a shallow p+ contact doping 634 provides ohmic contact from separate terminals B1 and B2 (on the two opposite faces of the die) to regions 632. In this example, dielectric-filled trenches 640 provide lateral separation between base contact regions 632 and emitter/collector regions 622. (Note that a p-type diffused region may be added to reduce the series resistance between the emitter-to-base junction and the base contact.) B-TRANs can provide significantly better efficiency than is conventionally available for existing static transfer switches; for example, a 1200V B-TRAN has an expected system efficiency of 99.9%.

Application US 2014-0375287 also describes some surprising aspects of operation of this kind of device. Notably: 1) when the device is turned on, it is preferably first operated merely as a diode, and base drive is then applied to reduce the on-state voltage drop. 2) Base drive is preferably applied to the base nearest whichever emitter/collector region will be acting as the collector (as determined by the external voltage seen at the device terminals). This is very different from typical bipolar transistor operation, where the base contact is (typically) closely connected to the emitter-base junction. 3) A two-stage turnoff sequence is preferably used. In the first stage of turnoff, the transistor is brought out of full bipolar conduction, but still is connected to operate as a diode; in the final state of turnoff diode conduction is blocked too. 4) In the off state, base-emitter voltage (on each side) is limited by an external low-voltage diode which parallels that base-emitter junction. This prevents either of the base-emitter junctions from getting anywhere close to forward bias, and avoids the degradation of breakdown voltage which can occur otherwise.

Since the B-TRAN is a fully symmetric device, there is no difference between the two emitter/collector regions. However, in describing the operation of the device, the externally applied voltage will determine which side is (instantaneously) acting as the emitter, and which is acting as the collector. The two base contact terminals are accordingly referred as the "e-base" and "c-base", where the c-base terminal is on the side of the device which happens to be the collector side at a given moment.

FIGS. 3A-3F (taken from published application 2014-0375287) show an example of the operating sequence as disclosed in that application.

FIG. 3A shows a sample equivalent circuit for one exemplary NPN BTRAN. Body diodes 312A and 312B can correspond to e.g. the upper and lower P-N junctions, respectively. In, for example, the sample embodiment of FIG. 1A, these can correspond to the junctions between emitter/collector regions 104A and base regions 102A. Switches 314A and 314B can short respective base terminals 108A and 108B to respective emitter/collector terminals 106A and 106B.

In one sample embodiment, a BTRAN can have six phases of operation in each direction, as follows.

1) Initially, as seen in FIG. 3B, voltage on emitter/collector terminal T1 is positive with respect to emitter/collector terminal T2. Switches 314A and 316A are open, leaving base terminal B1 open. Switch 314B is closed, shorting base terminal B2 to emitter/collector terminal T2. This, in turn, functionally bypasses body diode 312B. In this state, the device is turned off. No current will flow in this state, due to the reverse-biased P-N junction (represented by body diode 312A) at the upper side of the device.

2) As seen in FIG. 3C, the voltage on emitter/collector terminal T1 is brought negative with respect to emitter/collector terminal T2. P-N diode junction 312A is now forward biased, and now begins injecting electrons into the drift region. Current flows as for a forward-biased diode.

After a short time, e.g. a few microseconds, the drift layer is well-charged. The forward voltage drop is low, but greater in magnitude than 0.7 V (a typical silicon diode voltage drop). In one sample embodiment, a typical forward voltage drop (Vf) at a typical current density of e.g. 200 A/cm$^2$ can have a magnitude of e.g. 1.0 V.

3) To further reduce forward voltage drop Vf, the conductivity of the drift region is increased, as in e.g. FIG. 3D. To inject more charge carriers (here, holes) into the drift region, thereby increasing its conductivity and decreasing forward voltage drop Vf, base terminal B2 is disconnected from terminal T2 by opening switch 314B. Base terminal B2 is then connected to a source of positive charge by switch 316B. In one sample embodiment, the source of positive charge can be, e.g., a capacitor charged to +1.5 VDC. As a result, a surge current will flow into the drift region, thus injecting holes. This will in turn cause upper P-N diode junction 312A to inject even more electrons into the drift region. This significantly increases the conductivity of the drift region and decreases forward voltage drop Vf to e.g. 0.1-0.2 V, placing the device into saturation.

4) Continuing in the sample embodiment of FIG. 3D, current continuously flows into the drift region through base terminal B2 to maintain a low forward voltage drop Vf. The necessary current magnitude is determined by, e.g., the gain of equivalent NPN transistor 318. As the device is being driven in a high level injection regime, this gain is determined by high level recombination factors such as e.g. surface recombination velocity, rather than by low-level-regime factors such as thickness of, and carrier lifetime within, the base/drift region.

5) To turn the device off, as in e.g. FIG. 3E, base terminal B2 is disconnected from the positive power supply and connected instead to emitter terminal T2, opening switch 316B and closing switch 314B. This causes a large current to flow out of the drift region, which in turn rapidly takes the device out of saturation. Closing switch 314A connects base terminal B1 to collector terminal T1, stopping electron injection at upper P-N junction 312A. Both of these actions rapidly remove charge carriers from the drift region while only slightly increasing forward voltage drop Vf. As both base terminals are shorted to the respective emitter/collector terminals by switches 314A and 314B, body diodes 312A and 312B are both functionally bypassed.

6) Finally, at an optimum time (which can be e.g. nominally 2 μs for a 1200 V device), full turn-off can occur, as seen in e.g. FIG. 3F. Full turn-off can begin by opening switch 314B, disconnecting base terminal B2 from corresponding terminal T2. This causes a depletion region to form from lower P-N diode junction 312B as it goes into reverse bias. Any remaining charge carriers recombine, or are collected at the upper base. The device stops conducting and blocks forward voltage.

The procedure of steps 1-6 can, when modified appropriately, used to operate the device in the opposite direction. Steps 1-6 can also be modified to operate a PNP BTRAN (e.g. by inverting all relevant polarities).

SUMMARY

The present application teaches, among other innovations, methods and circuits for operating a B-TRAN, and modules and systems incorporating some or all of these innovations.

The present inventor has discovered, surprisingly, that when a B-TRAN is being operated in full-ON transistor mode (i.e. with low voltage drop and high current flow) the collector-side base contact (i.e. the "c-base") has a high impedance, up to the point where the current flow on the c-base starts to increase significantly. At that point the transistor is already operating with a very low voltage drop, and increased c-base current will degrade gain without much improvement in voltage drop.

The preferred base drive circuit operates as a voltage-source drive to the c-base (i.e. to the base contact on whichever side of the device is operating as the collector at a given moment). The preferred implementation of the drive circuit is operated by control signals to also provide diode-mode turn-on and pre-turnoff operation.

In some but not necessarily all preferred embodiments, two separate subcircuits are used, on each of the bases, for drive in different modes: one subcircuit provides an adjustable voltage for c-base drive in full-ON transistor mode, and the other subcircuit clamps one or both bases to the corresponding emitter/collector regions in diode-on mode or in pre-turnoff mode.

In some but not necessarily all preferred embodiments, power for the base drive circuit is provided by a self-synchronizing rectifier circuit.

Also, in some but not necessarily all preferred embodiments, the base drive voltage used to drive the c-base region (on the collector side) is varied while the base current at that terminal is monitored, so that no more base current than necessary is applied. This avoids reduced gain, and solves the difficult challenge of optimizing base drive in a B-TRAN.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Published US application US 2014-0375287 A1 (which is hereby incorporated by reference) disclosed (inter alia) novel bidirectional bipolar transistors known as "B-TRANs." As discussed above, the operating cycle of a B-TRAN includes, in succession, a "diode turn-on" (or "diode-ON") state, a low-$V_{ce}$ or "transistor-ON" state, a "pre-turnoff" state, and an "active OFF" state. Preferably the B-TRAN also has a "passive-OFF" state, which keeps its blocking voltage high when normal operation is not happening.

The present application describes improvements in the operation of these devices. One area of improvement has been in the fully ON state (the "transistor-ON" state). An important advantage of the B-TRAN is its low voltage drop $V_{CE}$ when fully on. However, it is desirable to maintain a high value for device gain. It is also desirable to keep the device's switching speed and reverse recovery fast. These improvements have been achieved by a better understanding of the device's behavior in the fully ON state.

For simplicity, the following description will assume that an NPN B-TRAN is being used. In this case the physical base is provided by the bulk of the p-type semiconductor die, and the base contact regions are p-type (with p+ contact doping). The two emitter/collector regions are n+, and whichever emitter/collector region sees a more positive external voltage will be the collector side. (The principles of operation are the same for PNP B-TRAN devices, with opposite polarity; in such devices the side which sees the more negative external voltage will be the collector side.)

The base contact region on the collector side will be referred to as the "c-base," and the other base contact region (on the emitter side) will be referred to as the "e-base." These base contact regions are not physically different, but behave very differently when an externally applied voltage is present.

The fully ON state (transistor-on) is reached by applying elevated drive voltage to the c-base. This provides a low on-state voltage drop with good gain, without reducing the breakdown voltage. Device gain is measured as beta, i.e. the ratio of emitter current to base current, but the behavior of the transistor under c-base drive is very different from that of other power bipolar junction transistors.

Figure 4:
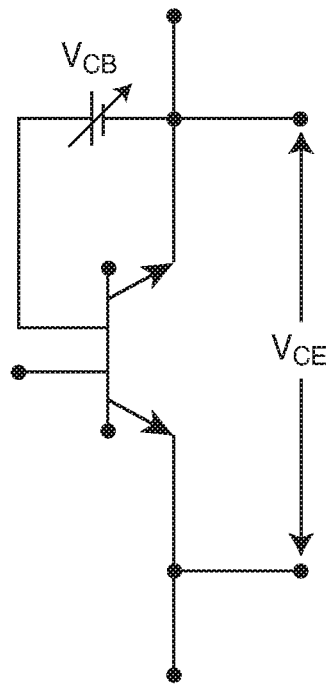
FIG. 4 shows a partial device model according to one sample embodiment of the present inventions.

FIG. 4 shows a partial device model, with a table of values for c-base bias $V_{CB}$ and corresponding voltage drop $V_{CE}$ across the external terminals. In this figure, the collector/emitter terminal at the top of the figure is assumed to be the collector (i.e. connected to the more positive external voltage), so the base contact which is shown connected to the variable voltage source is the c-base.

Figure 5:
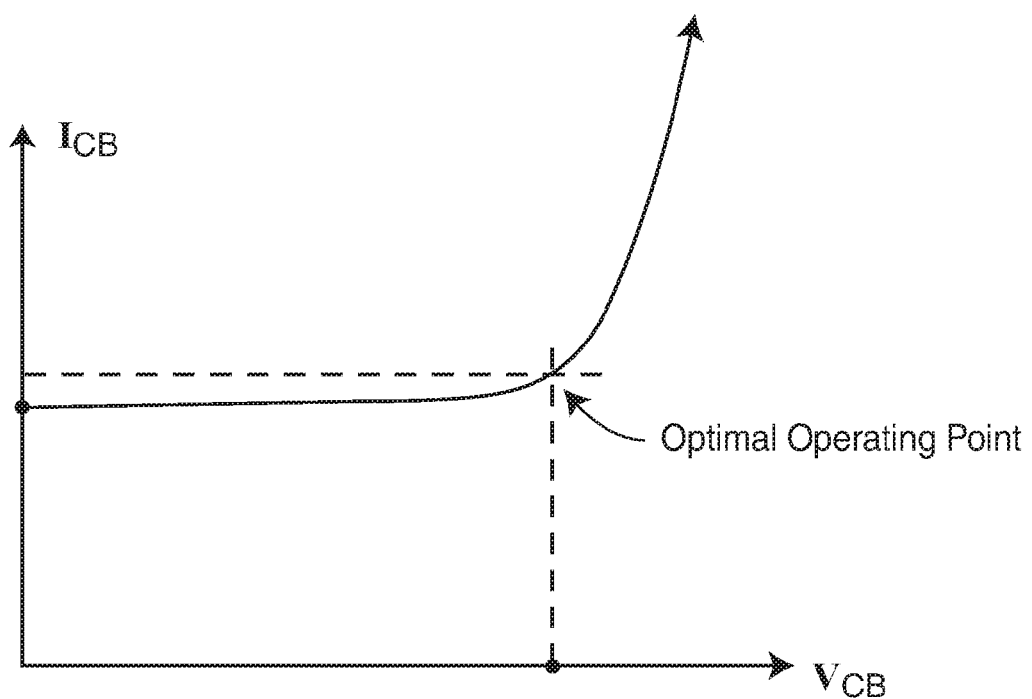
FIG. 5 shows how the base current $I_{CB}$ on the c-base varies with c-base bias $V_{CB}$ under operating conditions.
Figure 6:
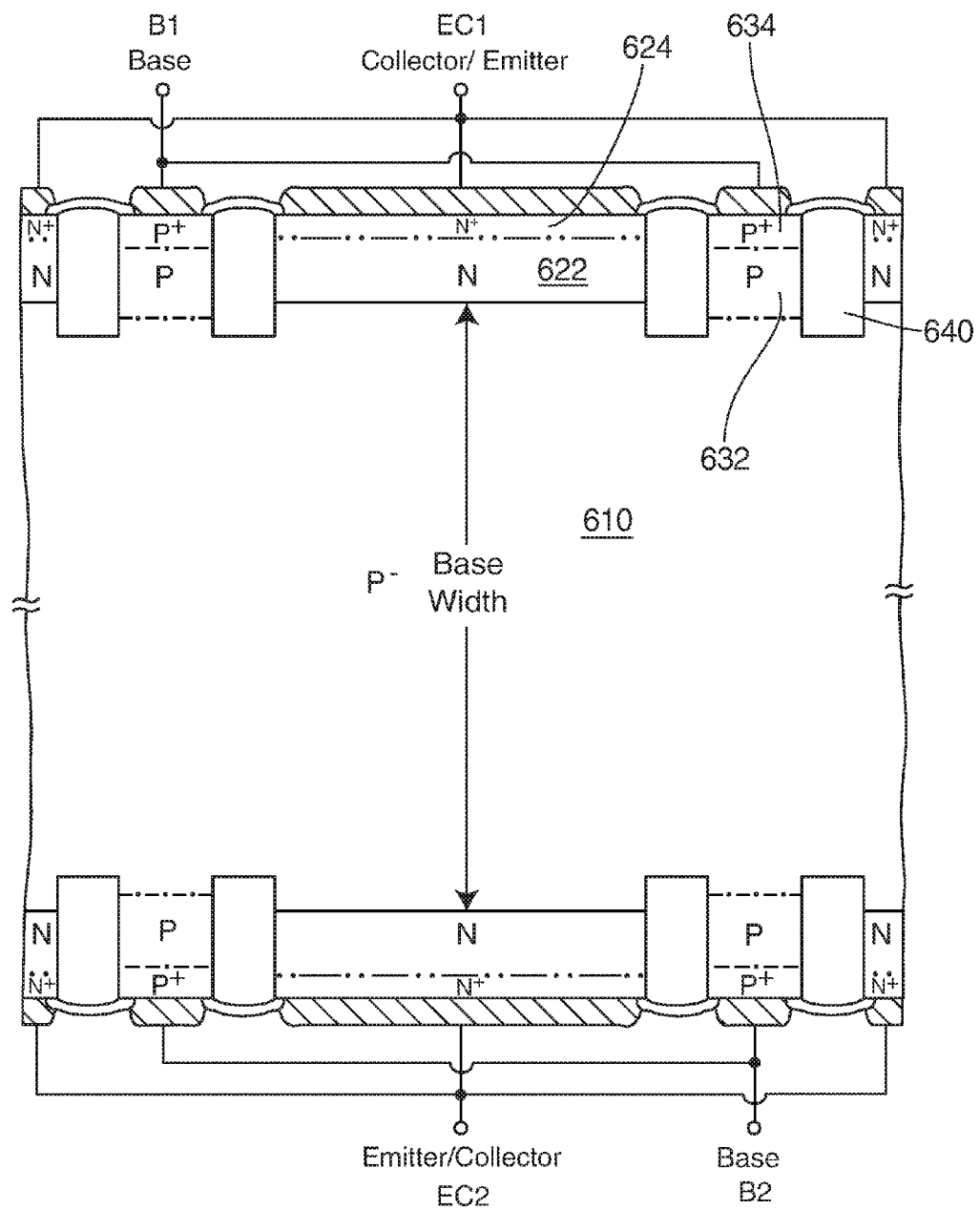
FIG. 6 shows one sample embodiment of a B-TRAN.

FIG. 5 shows how the base current $I_{CB}$ on the c-base varies with c-base bias $V_{CB}$ under operating conditions. It should be noted that current $I_{CB}$ is nearly flat over a wide range of values for $V_{CB}$.

The combination of FIGS. 4 and 5 shows important features of operation. The device's voltage drop $V_{CE}$ will come down to its desired low value when c-base bias $V_{CB}$ gets up to its optimal operating point (defined as described below), but the current on the c-base stays nearly constant as c-base bias is increased to this point. To put this differently, the c-base terminal has a very high impedance until its bias is increased to the point where the impedance drops. At this point, the device's series resistance is low, as desired.

In the transistor-on state, the e-base is essentially at a constant voltage—it varies only about 0.1 V from a low drive to a high drive condition. The c-base, in contrast, is a nearly constant current drive, even as the voltage is varied from 0 V above the collector to about 0.6V above the collector. Instead of the c-base current changing with c-base voltage, $V_{CE}$ changes. At a c-base bias of 0V (c-base shorted to collector), there is a certain gain that depends on the emitter current density, and Vce is nominally 0.9 V over a large range of current density. Raising the c-base bias to 0.1 V above the collector does not change the gain, but it lowers Vce by nominally 0.1 V. Raising c-base bias to 0.6V drops Vce to about 0.2 or 0.3 V. Thus, when driving the c-base, a voltage source is advantageously used, as in the sample embodiment of FIG. 1A, not a current source.

This is a very significant difference from the way BJTs are normally driven, which is from a current source into the base.

The differential impedance, in terms of di/dv, of the c-base itself is high. The c-base drive current changes very little with c-base to collector voltage $V_{CB}$ over a wide range of values, until $V_{CB}$ gets close to forward biasing the collector/base junction (over 0.6V at 25 C in silicon). That is why a voltage-source-type drive is needed. C-base current $I_{CB}$ changes with emitter current, increasing with increased emitter current even when $V_{CB}$ remains constant, but not much with changing $V_{CB}$ (up until a value of $V_{CB}$ where $I_{CB}$ begins to increase undesirably).

The impedance of the e-base is very low, as it keeps a nearly constant voltage while the c-base current is varied.

Figure 1A:
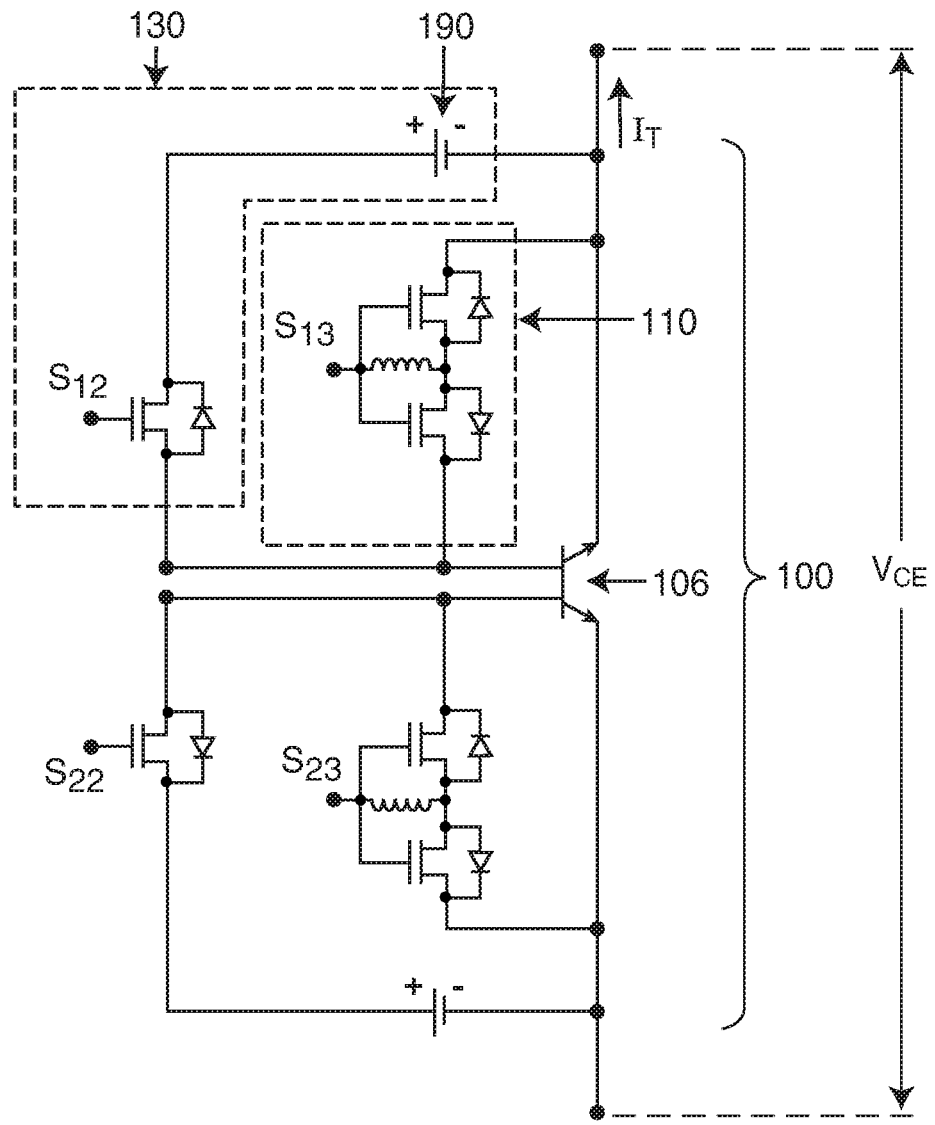
FIG. 1A shows one exemplary embodiment of a base drive circuit according to the present inventions.

FIG. 1A shows a first example of a complete switch 100, including an NPN B-TRAN transistor 106 as well as diode-mode drive circuitry 110 and transistor-mode drive circuitry 130. The half at the top of the page will be assumed to be the collector side, i.e. to be seeing the positive side of the applied voltage.

Figure 1B:
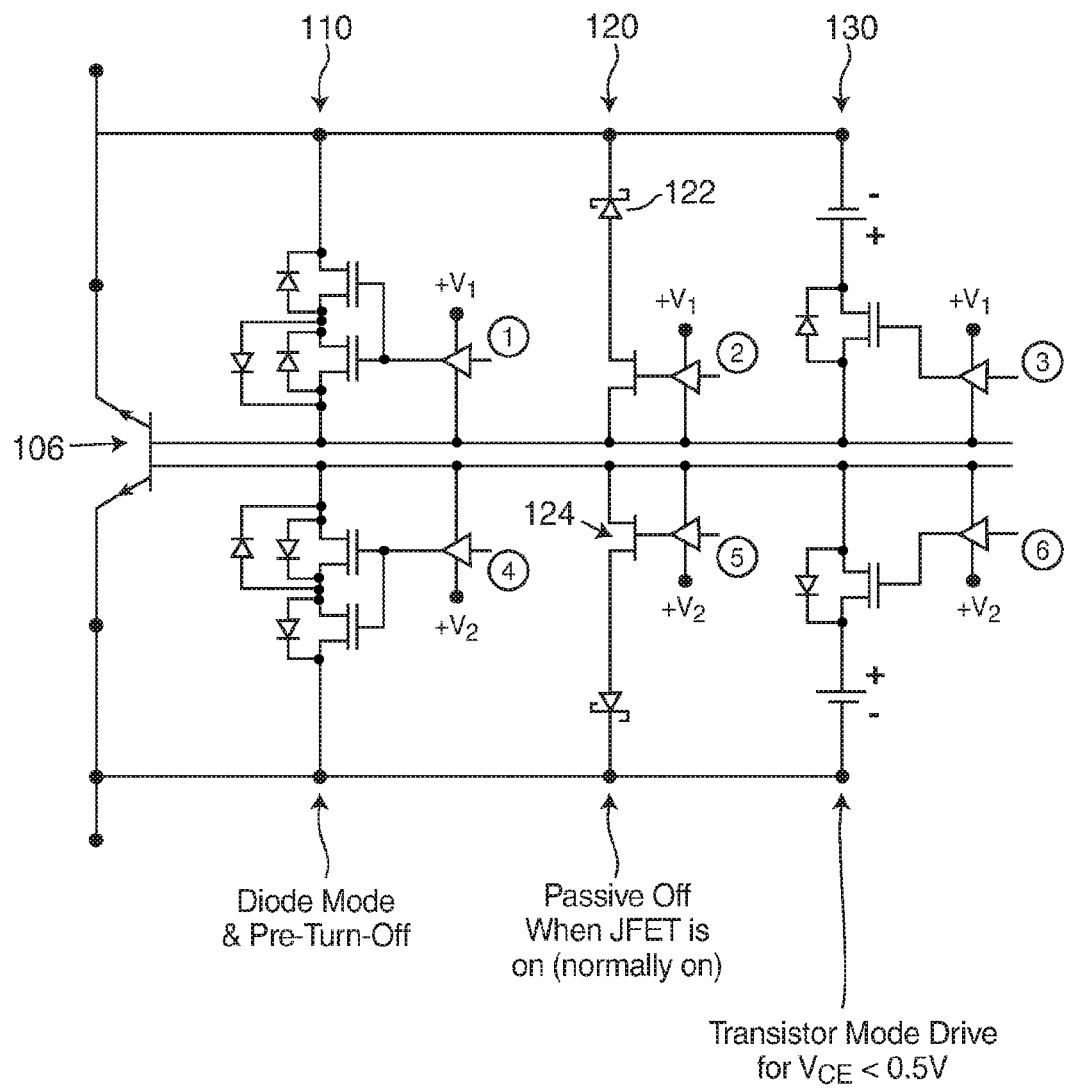
FIG. 1B shows one sample embodiment of a base drive circuit according to the present inventions.
Figure 1C:
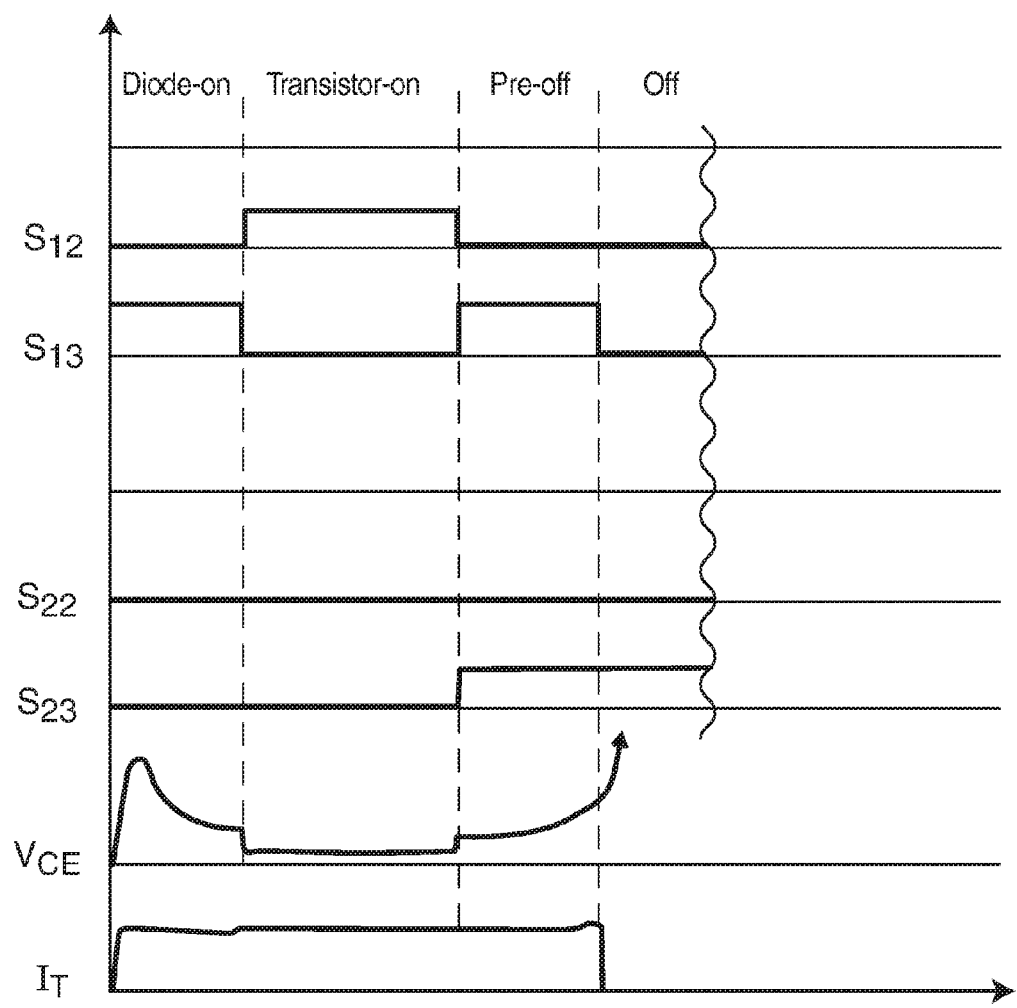
FIG. 1C shows exemplary waveforms during operation of the embodiment of FIG. 1A.

FIG. 1C shows an example of waveforms during the operation of the circuit of FIG. 1A. Initially, in the diode-on phase, the gate of NMOS S12 is low, and the gate of NMOS S13 is high. This enables the diode-turn-on mode described e.g. in published application US2014-0375287. NMOS transistors S22 and S23 remain off. During this time the current $I_T$ across the emitter/collector terminals turns on quickly, and voltage $V_{CE}$ across the emitter/collector terminals, which is assumed to have been ramping up under external drive, is brought down to approximately a diode drop (plus some ohmic drop, for a total of about 0.8V in silicon).

Next, in the transistor-on phase, S12 is turned on while S13 is turned off. S12 is connected to a variable-voltage source 190, which is derived from the collector terminal as described below. This voltage at the c-base drives the transistor into its low-voltage-drop state, where the voltage drop $V_{CE}$ is 0.3V or less. This phase continues for as long as drive current is needed.

In the pre-off phase, switch S12 is turned off, and switches S13 and S23 are both turned on. This immediately bumps the voltage drop up to a diode drop, but the device current $I_T$ remains at a level determined by emitter current density. If this current is not enough to clamp the voltage of the external load, the applied voltage will increase as shown.

Finally, in the active-off phase, switch S13 is turned off, but switch S23 remains on. This cuts off device current $I_T$, and the voltage on the device goes up to whatever is dictated by the external connections.

Note that switch S23 was never turned on during this sequence. This switch would be turned on to achieve the transistor-on mode when the external voltage has reversed (so that the emitter/collector terminal node at the top of the page is then the emitter side rather than the collector side).

Figure 2:
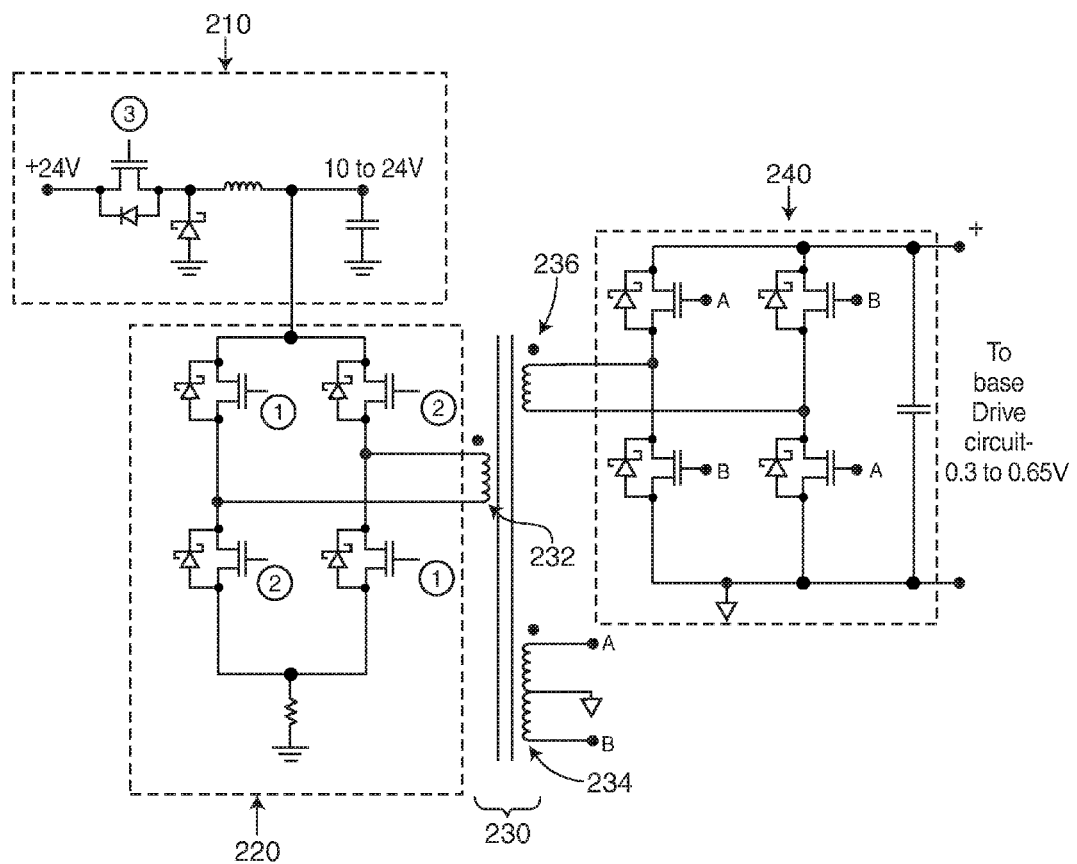
FIG. 2 shows one sample embodiment of a variable-voltage self-synchronous rectifier.
Figure 3A:
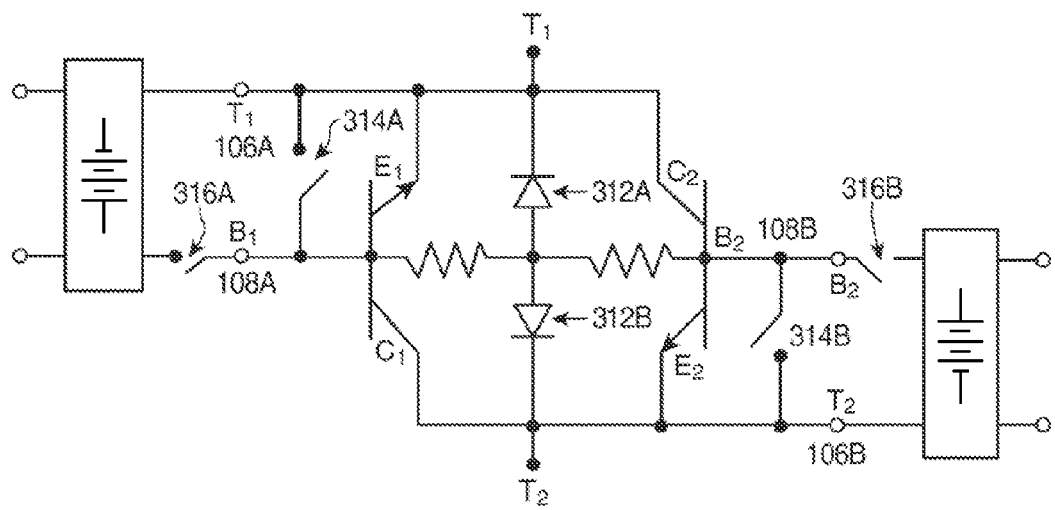
FIGS. 3A, 3B, 3C, 3D, 3E, and 3F show sample equivalent circuits for an exemplary B-TRAN in various stages of operation.
Figure 3B:
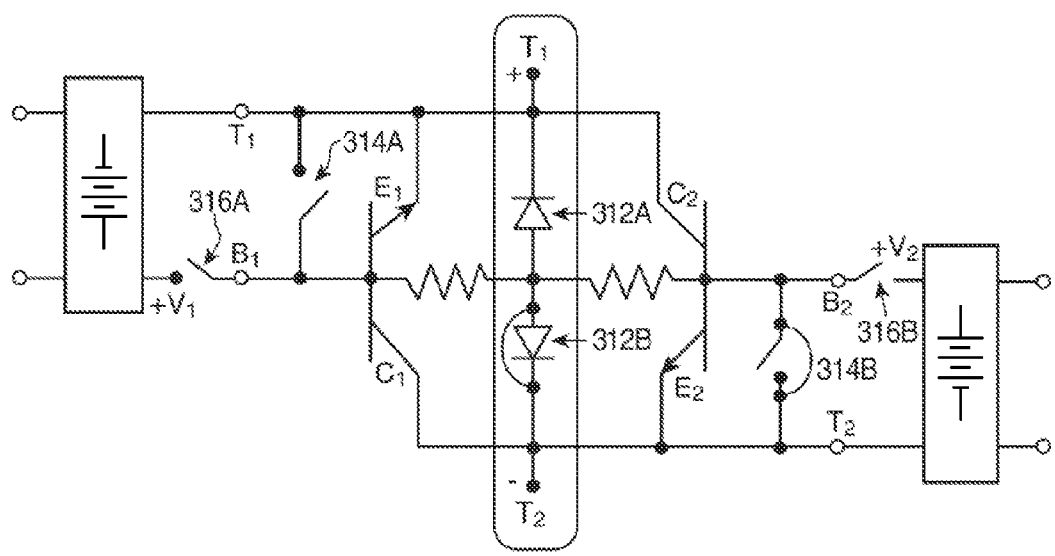
Figure 3C:
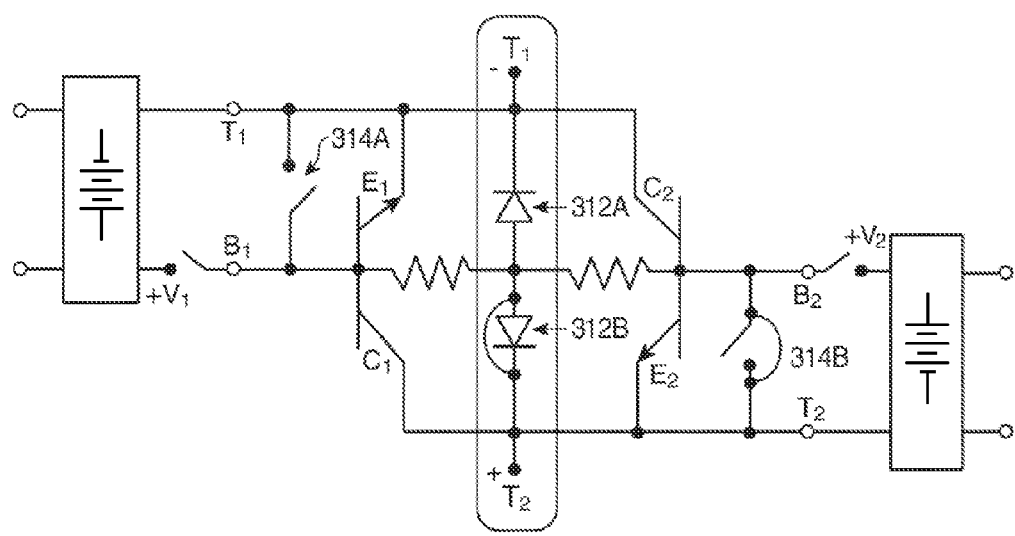
Figure 3D:
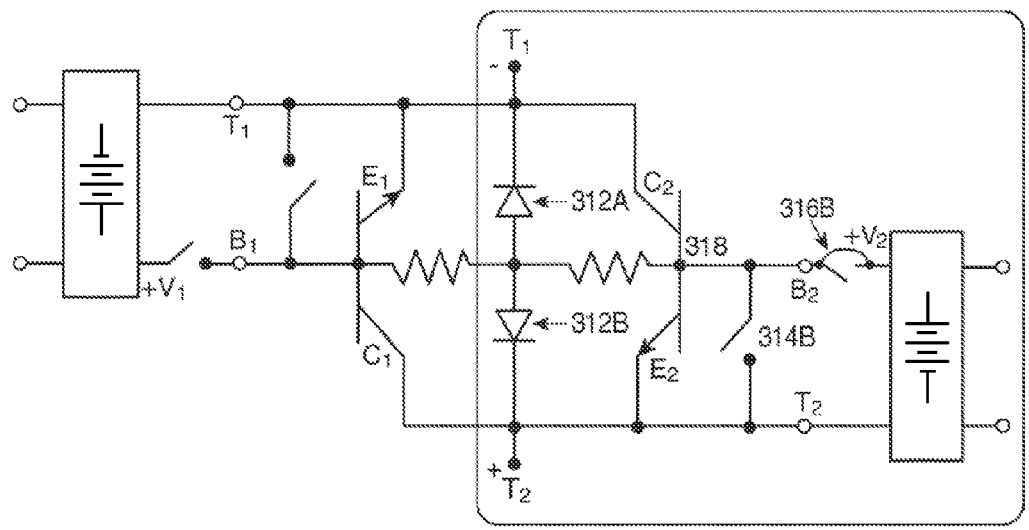
Figure 3E:
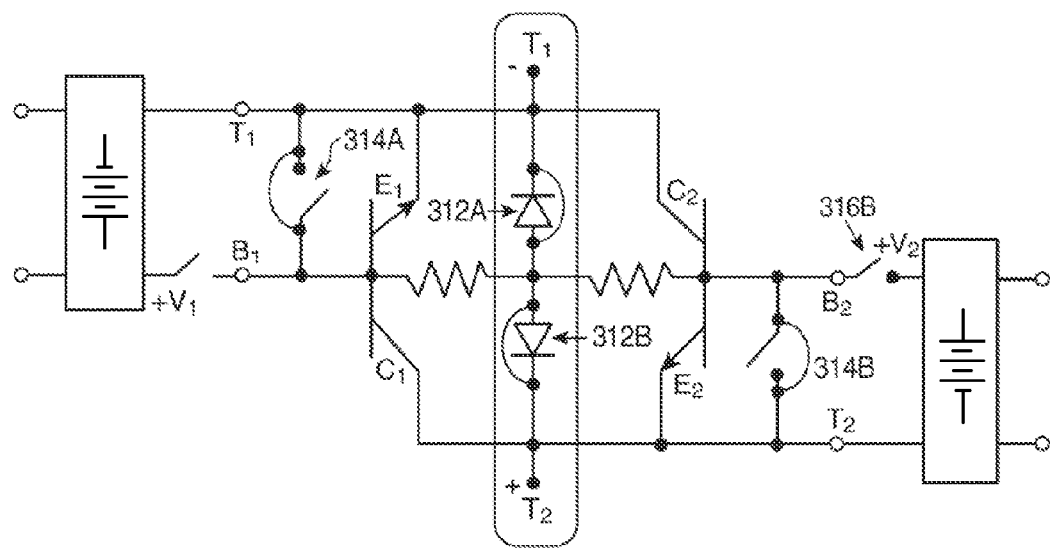
Figure 3F:
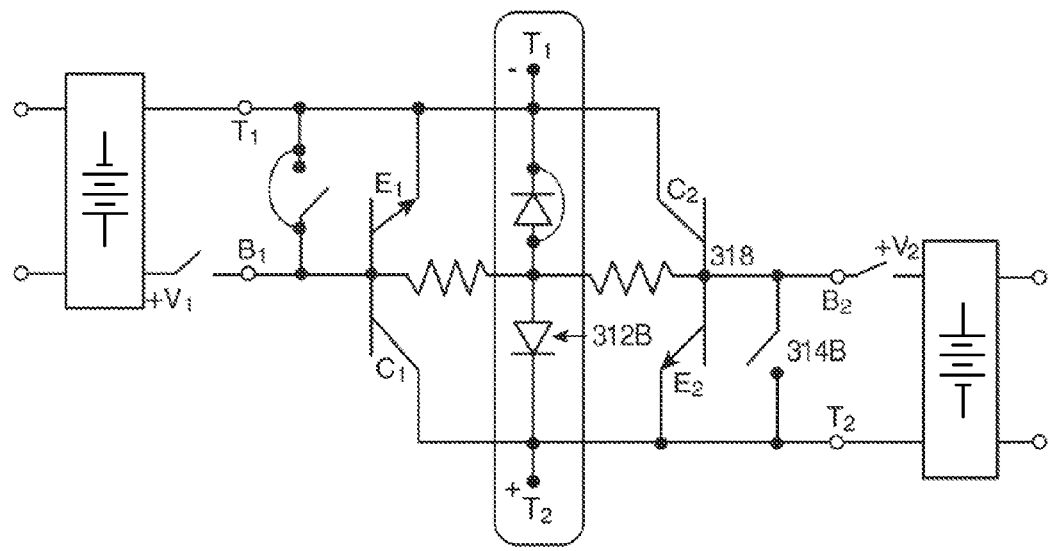

FIG. 2 shows one sample embodiment of a variable-voltage self-synchronous rectifier, which can be advantageously used in the sample embodiment of FIG. 1A. A variable-voltage supply 210 (which in the example shown is a simple buck converter) provides an adjustable supply voltage to oscillator 220. Oscillator 220 drives a first winding 232 of a transformer 230. A first secondary winding 234 provides complementary outputs A and B, which are synchronous with the transitions of oscillator 220, plus the phase shift due to coupling through the transformer 230. Another secondary winding 236 provides a higher-current and lower-voltage waveform, corresponding to the output of oscillator 220 (with voltage shifted). The output of the two secondary windings is synchronous, so that the control signals A and B can be used to drive the synchronous inverter 240. The control signals A and B are preferably scaled to provide appropriate gate voltages for the four transistors of the synchronous inverter, e.g. 5V. Thus a 24V DC supply has been efficiently translated into a very-low-voltage DC output whose voltage can be varied. By changing the set-point voltage of the buck converter, the voltage applied to the c-base terminal can be adjusted.

Returning now to FIG. 5, the bias on the c-base terminal is optimized by adjusting it to the point where base current is no longer constant.

Unlike the e-base contact, the c-base contact is high impedance, meaning that the current $I_{CB}$ going into the c-base is nominally constant, when the device is on, until $V_{CB}$ gets close to forward biasing the base-collector junction. At that point, $V_{CE}$ is well below a diode drop (nominally 0.2V), and $I_{CB}$ starts increasing rapidly with small additional increases in $V_{CB}$, as shown below.

The present application teaches, among other concepts, that $V_{CB}$ is dynamically varied, or "dithered", to find the Optimal Operating Point. The Optimal Operating Point should fall where $I_{CB}$ has increased some small but measurable amount above the flat portion of the $I_{CB}/V_{CB}$ curve. This is done by finding a $V_{CB}$ where the slope of the curve is some optimal value.

In one sample embodiment, the optimal value for the "transconductance", or the optimal operating point, is when the base drive current is 20% over the base drive current for the c-base to collector shorted condition $V_{CB}$=0 V. This point can be found, in practice, by any number of dithering sequences; in one example a baseline value for $I_{CB}$ can be found in diode mode, and then a target value is calculated, e.g. by increasing the baseline current value by 10% or 20% or 30%. Voltage $V_{CB}$ is then increased in small steps, e.g. in 1% increments, until the measured collector current reaches the target value. Optionally two limit values can be calculated, and the control voltage $V_{CB}$ ramped back down when the upper limit value for $I_{CB}$ is reached during operation. Optionally this dithering process can be repeated at short intervals when the transistor is in the ON state for long periods of time.

FIG. 1B shows an example of a more complete base drive circuit. This is slightly different from the drive circuit of FIG. 1A in that antiparallel diodes are connected with the body diodes in two of the MOS transistors in the diode-mode drive circuitry 110. Moreover, FIG. 1B also shows the JFET plus Schottky branches which form the passive-off protection circuitry 120.

A B-TRAN is in the "active off-state" when the e-base (base on emitter side) is shorted to the emitter, and the c-base (base on the collector side) is open. In this state with the NPN B-TRAN, the collector is the anode (high voltage side), and the emitter is the cathode (low voltage side).

The B-TRAN is also off when both bases are open, but due to the high gain of the B-TRAN in this state, the breakdown voltage is low. The series combination of a normally-ON JFET and a Schottky diode attached between each base on its respective emitter/collector, as previously disclosed, will significantly increase the blocking voltage in this "passive off-state". The JFETs are turned off during normal operation.

One presently-preferred sample embodiment for B-TRAN turn-on is to simultaneously, from the active off-state and blocking forward voltage, open the e-base to emitter short while shorting the c-base to the collector. This immediately introduces charge carriers into the highest field region of the depletion zone around the collector/base junction, so as to achieve very fast, forward biased turn-on for hard switching, very similar to IGBT turn-on.

Another advantageous turn-on method, from the active off-state, occurs when the circuit containing the B-TRAN reverses the polarity of the voltage applied to the B-TRAN, which produces the same base state described in the hard turn-on method, but at near zero voltage. That is, the e-base which is shorted to the emitter becomes the c-base shorted to the collector as the B-TRAN voltage reverses from the active off-state polarity. Again, turn-on is fast.

In a third turn-on method from the active off-state, the e-base is disconnected from the emitter, and connected to a current or voltage source of sufficient voltage to inject charge carriers into the base region. This method is likely slower, since the charge carriers go into the base just below the depletion zone. Also, it is known that carrier injection into the e-base results in inferior gain relative to carrier injection into the c-base.

After turn-on is achieved with either of the methods using the c-base, Vice is more than a diode drop. To drive $V_{CE}$ below a diode drop, turn-on goes to the second stage of increased charge injection into the c-base via a voltage or current source. The amount of increased charge injection determines how much $V_{CE}$ is reduced below a diode drop. Injection into the e-base will also reduce $V_{CE}$, but the gain is much lower than with c-base injection.

Turn-off can be achieved by any of several methods. The most advantageous method is a two-step process. In the first step, the c-base is disconnected from the carrier injection power supply and shorted to the collector, while the previously open e-base is shorted to the emitter. This results in a large current flow between each base and its emitter/collector, which rapidly removes charge carriers from the drift region. This in turn results in a rising Vce as the resistivity of the drift region increases. At some optimum time after the bases are shorted, the connection between the c-base and the collector is opened, after which Vce increases rapidly as the depletion region forms around the collector/base junction.

Alternately, turn-off can be achieved by simply opening the c-base and shorting the e-base to the emitter, but this will result in higher turn-off losses since the drift region (base) will have a high level of charge carriers at the start of depletion zone formation.

Or, turn-off can be achieved by simply opening the c-base and leaving the e-base open, but this will result in the highest turn-off losses and also a low breakdown voltage.

In one sample embodiment, the base drive uses only N-channel MOSFETs to drive the B-TRANs. This makes advantageous use of low MOSFET output voltage (less than 0.7V). The input is most preferably variable voltage, which, with current sensing, can be used to determine the optimum base drive voltage.

Another sample embodiment can support higher voltages, but uses both N-channel and P-channel MOSFETs.

Advantages

The disclosed innovations, in various embodiments, provide one or more of at least the following advantages. However, not all of these advantages result from every one of the innovations disclosed, and this list of advantages does not limit the various claimed inventions.

High gain;
Low ON-state voltage drop;
Avoidance of breakdown;
Inherent current limiting;
Simple circuit implementation;
Minimized power dissipation;
Adjustable supply voltage.

According to some but not necessarily all embodiments, there is provided: The present application teaches, among other innovations, methods and circuits for operating a B-TRAN (double-base bidirectional bipolar junction transistor). A base drive circuit is described which provides high-impedance drive to the base contact region on whichever side of the device is operating as the collector (at a given moment). (The B-TRAN, unlike other bipolar junction transistors, is controlled by applied voltage rather than applied current.) The preferred implementation of the drive circuit is operated by control signals to provide diode-mode turn-on and pre-turnoff operation, as well as a hard ON state with a low voltage drop (the "transistor-ON" state). In some but not necessarily all preferred embodiments, an adjustable low voltage for the gate drive circuit is provided by a self-synchronizing rectifier circuit. Also, in some but not necessarily all preferred embodiments, the base drive voltage used to drive the c-base region (on the collector side) is varied while the base current at that terminal is monitored, so that no more base current than necessary is applied. This solves the difficult challenge of optimizing base drive in a B-TRAN.

According to some but not necessarily all embodiments, there is provided: A system for power switching, comprising: a bidirectional bipolar transistor which has two first-conductivity-type emitter/collector regions separated by a bulk second-conductivity-type base region, and two distinct second-conductivity-type base contact regions which connect to the bulk base region in mutually separate locations; and first and second transistor-mode drive circuits, separately connected to the first and second base contact regions respectively; wherein each drive circuit is configured, as a voltage source, to selectably apply an adjustable voltage between the corresponding base contact region and the emitter/collector region which is nearest to that base contact region; and first and second diode-mode drive circuits, separately connected to the first and second base contact regions respectively; wherein each drive circuit is configured to selectably connect the corresponding base contact region to the emitter/collector region which is nearest to that base contact region.

According to some but not necessarily all embodiments, there is provided: A system for power switching, comprising: a bidirectional bipolar transistor which has two first-conductivity-type emitter/collector regions separated by a bulk second-conductivity-type base region, and two distinct second-conductivity-type base contact regions which connect to the bulk base region in mutually separate locations; and a pair of transistor-mode drive circuits, separately connected to the first and second base contact regions respectively, wherein each transistor-mode drive circuit is a voltage-mode drive circuit; and a pair of diode-mode drive circuits, separately connected to the first and second base contact regions respectively; wherein each diode-mode drive circuit is configured to selectably connect the corresponding base contact region to the emitter/collector region which is nearest to that base contact region.

According to some but not necessarily all embodiments, there is provided: A system for power switching, comprising: a bidirectional bipolar transistor which has two first-conductivity-type emitter/collector regions separated by a bulk second-conductivity-type base region, and two distinct second-conductivity-type base contact regions which connect to the bulk base region in mutually separate locations; and a pair of transistor-mode drive circuits, separately connected to the first and second base contact regions respectively; wherein each drive circuit is configured, as a voltage source, to selectably apply an adjustable voltage at a selectable value between the corresponding base contact region and the emitter/collector region which is nearest to that base contact region.

According to some but not necessarily all embodiments, there is provided: A method for power switching, comprising: driving a bidirectional bipolar transistor which has two first-conductivity-type emitter/collector regions in distinct locations separated by a bulk second-conductivity-type base region, and two distinct second-conductivity-type base contact regions which connect to the bulk base region in mutually separate locations, by in a transistor-ON mode, when minimal voltage drop is desired, using one of a pair of first drive circuits to supply a selected adjustable voltage to the one of the base contact regions which is closest to whichever of the emitter/collector regions is positioned to act as the collector, as defined by externally applied voltage polarity; and in a diode-ON mode, when a diode drop across the device is acceptable, using one of a pair of second drive circuits to clamp one of the base contact regions to the respectively nearest one of the emitter/collector regions; and in a preturnoff mode, using both of the pair of second drive circuits to clamp each of the base contact regions to the respectively nearest one of the emitter/collector regions.

According to some but not necessarily all embodiments, there is provided: A method for power switching, comprising: driving a bidirectional bipolar transistor which has two first-conductivity-type emitter/collector regions in distinct locations separated by a bulk second-conductivity-type base region, and two distinct second-conductivity-type base contact regions which connect to the bulk base region in mutually separate locations, by, in a transistor-ON mode, when minimal voltage drop is desired, using one of a pair of first drive circuits to supply a selected adjustable voltage to the one of the base contact regions which is closest to whichever of the emitter/collector regions is positioned to act as the collector, as defined by externally applied voltage polarity; and in a diode-ON mode, when a diode drop across the device is acceptable, using one of a pair of second drive circuits to clamp one of the base contact regions to the respectively nearest one of the emitter/collector regions.

According to some but not necessarily all embodiments, there is provided: A method for power switching, comprising: driving a bidirectional bipolar transistor which has two first-conductivity-type emitter/collector regions in distinct locations separated by a bulk second-conductivity-type base region, and two distinct second-conductivity-type base contact regions which connect to the bulk base region in mutually separate locations, by, in a transistor-ON mode, when minimal voltage drop is desired, using one of a pair of first drive circuits to supply a selected adjustable voltage to the one of the base contact regions which is closest to whichever of the emitter/collector regions is positioned to act as the collector, as defined by externally applied voltage polarity.

According to some but not necessarily all embodiments, there is provided: A method of providing a variable-voltage low-voltage output, comprising the actions of: a) providing an adjustable voltage to supply an oscillator; b) using the oscillator to apply an AC waveform to a primary winding of a transformer; c) at one secondary winding of the transformer, generating complementary control signals; and d) using the complementary control signals to operate a synchronous rectifier which is connected to another secondary winding of the same transformer, to thereby provide a low-voltage output.

According to some but not necessarily all embodiments, there is provided: A variable-voltage low-voltage power circuit, comprising: an adjustable voltage supply circuit, connected to provide an adjustable voltage; an oscillator circuit, connected to receive the adjustable voltage as a supply voltage, and connected to drive a primary winding of a transformer with an AC waveform; a first secondary winding of the transformer, connected to output complementary control signals; and a second secondary winding of the transformer, having fewer turns than the first secondary winding; and a synchronous rectifier, including at least four transistors which are gated by the complementary control signals and are connected in a bridge configuration, which is connected to rectify the output of the secondary winding; wherein the output of the second secondary winding, after rectification by the synchronous rectifier, provides a substantially DC output which is smaller than a diode drop.

According to some but not necessarily all embodiments, there is provided: A method of operating a bidirectional bipolar transistor which has first and second first-conductivity-type emitter/collector regions in distinct locations separated by a bulk second-conductivity-type base region, and also has two distinct second-conductivity-type base contact regions which connect to the bulk base region in mutually separate locations, in respective proximity to first and second emitter/collector regions but not to each other, comprising the actions of: a) when low on-state resistance is desired, applying a base drive voltage to whichever of the base contact regions is then on the collector side of the device; and b) varying the base drive voltage while monitoring base current, to thereby find a target base drive voltage where base current begins to increase with base drive voltage; and operating the transistor at approximately the target base drive voltage.

According to some but not necessarily all embodiments, there is provided: A system for power switching, comprising: a bidirectional bipolar transistor which has two first-conductivity-type emitter/collector regions separated by a bulk second-conductivity-type base region, and two distinct second-conductivity-type base contact regions which connect to the bulk base region in mutually separate locations; and a pair of transistor-mode drive circuits, separately connected to the first and second base contact regions respectively; wherein, during the transistor-ON state where low voltage drop is desired, one of the drive circuits, as determined by external voltage polarity, is configured to apply an adjustable voltage to a selected one of base contact regions, and dither the adjustable voltage, to thereby find an operating point voltage where the current at the selected base contact begins to increase with applied voltage, and then keep the adjustable voltage at approximately the operating point voltage.

Modifications And Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For one example, the main embodiments described above use NPN B-TRAN transistors. However, the same principles apply to PNP B-TRAN transistors, with appropriate inversion of voltages.

For another example, the teachings here can be applied to B-TRAN devices of various sizes, depending on what blocking voltage and current capacity are required.

For another example, a wide variety of other sensors and/or control relationships can be added onto the conceptual circuit relations shown in this application.

For another example, where a B-TRAN is used as part of a larger circuit (e.g. a PPSA converter), a single control module can optionally be connected to apply the appropriate control signals to each of the B-TRANs' drive circuits.

For another example, because voltage-mode drive is used, a single B-TRAN drive circuit can optionally be used to drive multiple B-TRANs in parallel. This is not practical with other bipolar junction transistors.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A system for power switching, comprising:
   a bidirectional bipolar transistor which has two first-conductivity-type emitter/collector regions separated by a bulk second-conductivity-type base region, and two distinct second-conductivity-type base contact regions which connect to the bulk base region in mutually separate locations; and
   first and second transistor-mode drive circuits, separately connected to the first and second base contact regions respectively; wherein each transistor-mode drive circuit is configured, as a voltage source, to selectively apply an adjustable voltage between the corresponding base contact region and the emitter/collector region which is nearest to that base contact region; and
   first and second diode-mode drive circuits, separately connected to the first and second base contact regions respectively; wherein each diode-mode drive circuit is configured to selectively connect the corresponding base contact region to the emitter/collector region which is nearest to that base contact region.

2. The system of claim 1, wherein the first conductivity type is n-type.

3. The system of claim 1, further comprising two additional drive circuits, respectively connected in parallel with the transistor-mode drive circuits, and each comprising a Schottky diode in series with a normally-off switch.

4. A system for power switching, comprising:
   a bidirectional bipolar transistor which has two first-conductivity-type emitter/collector regions separated by a bulk second-conductivity-type base region, and two distinct second-conductivity-type base contact regions which connect to the bulk base region in mutually separate locations; and
   a pair of transistor-mode drive circuits, separately connected to the first and second base contact regions respectively, wherein each transistor-mode drive circuit is a voltage-mode drive circuit; and
   a pair of diode-mode drive circuits, separately connected to the first and second base contact regions respectively; wherein each diode-mode drive circuit is configured to selectively connect the corresponding base contact region to the emitter/collector region which is nearest to that base contact region.

5. The system of claim 4, wherein the first conductivity type is n-type.

6. The system of claim 4, further comprising two additional drive circuits, respectively connected in parallel with the transistor-mode drive circuits, and each comprising a Schottky diode in series with a normally-off switch.

7. A system for power switching, comprising:
- a bidirectional bipolar transistor which has two first-conductivity-type emitter/collector regions separated by a bulk second-conductivity-type base region, and two distinct second-conductivity-type base contact regions which connect to the bulk base region in mutually separate locations; and
- a pair of transistor-mode drive circuits, separately connected to the first and second base contact regions respectively; wherein each transistor-mode drive circuit is configured, as a voltage source, to selectively apply an adjustable voltage at a selectable value between the corresponding base contact region and the emitter/collector region which is nearest to that base contact region.

8. The system of claim 7, wherein the first conductivity type is n-type.

9. The system of claim 7, further comprising two additional drive circuits, respectively connected in parallel with the transistor-mode drive circuits, and each comprising a Schottky diode in series with a normally-off switch.

* * * * *